United States Patent
Roberts et al.

(10) Patent No.: US 7,125,650 B2
(45) Date of Patent: Oct. 24, 2006

(54) METHOD FOR BUMP EXPOSING RELIEF IMAGE PRINTING PLATES

(76) Inventors: David H. Roberts, 2704 Levante St., Carlsbad, CA (US) 92009; Gregory E. Mueller, 1770 Cottage Grove Dr., Encinitas, CA (US) 92024

( * ) Notice: Subject to any disclaimer, the term of this patent is extended or adjusted under 35 U.S.C. 154(b) by 0 days.

(21) Appl. No.: 10/894,979

(22) Filed: Jul. 20, 2004

(65) Prior Publication Data

US 2006/0019193 A1 Jan. 26, 2006

(51) Int. Cl.
*G03F 7/26* (2006.01)
(52) U.S. Cl. ............... 430/306; 430/270.1; 430/271.1; 430/278.1; 430/281.1; 430/286.1; 430/302; 430/494; 430/944; 430/945
(58) Field of Classification Search ............ 430/270.1, 430/271.1, 278.1, 281.1, 286.1, 302, 306, 430/494, 944, 945
See application file for complete search history.

(56) References Cited

U.S. PATENT DOCUMENTS

| | | | |
|---|---|---|---|
| 3,265,765 A | 8/1966 | Holden et al. | |
| 3,479,185 A | 11/1969 | Chambers, Jr. | |
| 3,867,153 A | 2/1975 | Maclachlan | |
| 3,877,939 A * | 4/1975 | Okai | 430/276.1 |
| 4,264,705 A | 4/1981 | Allen | |
| 4,320,188 A | 3/1982 | Heinz et al. | |
| 4,323,636 A | 4/1982 | Chen | |
| 4,323,637 A | 4/1982 | Chen et al. | |
| 4,369,246 A | 1/1983 | Chen et al. | |
| 4,414,312 A | 11/1983 | Goff et al. | |
| 4,423,135 A | 12/1983 | Chen et al. | |
| 4,427,759 A | 1/1984 | Gruetzmacher et al. | |
| 4,540,649 A | 9/1985 | Sakurai | |
| 4,622,088 A | 11/1986 | Min | |
| 5,135,827 A | 8/1992 | Bohm et al. | |
| 5,223,375 A | 6/1993 | Berrier et al. | |
| 5,262,275 A | 11/1993 | Fan | |
| 5,330,882 A * | 7/1994 | Kawaguchi et al. | 430/327 |
| 5,455,416 A * | 10/1995 | Zertani et al. | 250/215 |
| 5,645,974 A | 7/1997 | Ohta et al. | |
| 5,925,500 A | 7/1999 | Yang et al. | |
| 6,238,837 B1 | 5/2001 | Fan | |
| 6,706,462 B1 | 3/2004 | Murota et al. | |
| 2002/0072011 A1 | 6/2002 | Murota et al. | |
| 2003/0219681 A1 | 11/2003 | Cheng et al. | |
| 2004/0234886 A1 * | 11/2004 | Rudolph et al. | 430/204 |

FOREIGN PATENT DOCUMENTS

| | | |
|---|---|---|
| EP | 1366769 | 9/1974 |
| EP | 460 919 A2 * | 12/1991 |
| EP | 0 456 336 B1 | 6/1997 |
| EP | 0 640 878 B1 | 2/2003 |

\* cited by examiner

*Primary Examiner*—Barbara L. Gilliam
(74) *Attorney, Agent, or Firm*—Carmody & Torrance LLP

(57) ABSTRACT

A process of producing a relief image printing plate, the process comprising the steps of providing a photosensitive printing element, quenching dissolved oxygen in the photosensitive resin layer by pre-exposing the photosensitive layer to one or more sources of actinic radiation, wherein the range of wavelengths spanned by the one or more sources of actinic radiation differs by no more than about 20 nm, and imagewise exposing the photosensitive resin layer to actinic radiation to crosslink and cure the photosensitive resin layer. The photosensitive composition typically comprises at least one photoinitiator that is present in the photosensitive composition in an amount sufficient to provide an optical density in the photosensitive composition of between about 0.05 and 0.43 at a wavelength used to pre-expose the photosensitive composition.

18 Claims, No Drawings

METHOD FOR BUMP EXPOSING RELIEF IMAGE PRINTING PLATES

FIELD OF THE INVENTION

This invention relates to an improved method of pre-exposing a photosensitive printing element to actinic radiation prior to imagewise exposure.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of, in order, a backing, or support layer; one or more unexposed photocurable layers; a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include steel, copper, or aluminum sheets, plates, or foils; paper; or films or sheets made from synthetic polymeric materials such as polyesters, polystyrene, polyolefins, polyamides, and the like. The support sheet can optionally comprise an adhesive layer for more secure attachment to the photocurable layer(s). Optionally, an adhesion layer or an antihalation layer may also be provided between the support layer and the one or more photocurable layers. An antihalation layer is used to minimize halation caused by the scattering of UV light within the non-image areas of the photocurable resin layer.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzrnacher, et al., U.S. Pat. No. 4,622,088 to Min, and U.S. Pat. No. 5,135,827 to Bohm, et al., the subject matter of each of which is herein incorporated by reference in its entirety. If a second photocurable layer is used, i.e., an overcoat layer, it typically is disposed upon the first layer and is similar in composition.

The photocurable materials generally cross-link (cure) and harden through radical polymerization in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions. One suitable source of actinic radiation is a mercury arc lamp, although other sources are generally known to those skilled in the art.

The slip film is a thin layer, which protects the photopolymer from dust and increases its ease of handling. In a conventional plate making process, the slip film is transparent to UV light. In this process, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative on a digital (i.e., laser ablatable) masking layer, which is generally a slip film which has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photocurable material to create a relief image on the surface of the photosensitive printing element. Typical methods of development include washing with various solvents or water, often with a brush. Other possibilities for development include the use of an air knife or heat plus a blotter. The resulting surface has a relief pattern that reproduces the image to be printed. The printing element may then be mounted on a press and printing commenced.

Photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore preferable that the dissolved oxygen be removed from the resin composition before image-wise exposure so that the photocurable resin composition can be more rapidly and uniformly cured.

The removal of the dissolved oxygen may be accomplished by placing the photosensitive resin plate in an atmosphere of inert gas, such as carbon dioxide gas or nitrogen gas, overnight before exposure in order to displace the dissolved oxygen. The drawback to this method is that it is inconvenient and cumbersome and requires a large space for the apparatus. This approach has generally been replaced by subjecting the plates to a preliminary exposure (i.e., "bump exposure").

During bump exposure, a low intensity "pre-exposure" dose of actinic radiation is used to sensitize the resin before the plate is subjected to the higher intensity main exposure dose of actinic radiation. The bump exposure is applied to the entire plate area and is a short, low dose exposure of the plate that ostensibly reduces the concentration of oxygen, which inhibits photopolymerization of the plate (or other printing element). Without this pre-sensitization step, fine features (i.e., highlight dots, fine lines, isolated dots, etc.) are not preserved on the finished plate. However, the pre-sensitization step often tends to cause shadow tones to fill in, thereby reducing the tonal range of the halftones in the image. This is exacerbated in plate formulations that have very high sensitivity and small exposure latitude.

The bump exposure also requires specific conditions that are limited to only quench the dissolved oxygen, such as exposing time, irradiated light density and the like. In addition, if the photosensitive resin layer has a thickness of more than 0.1 mm, the weak light of the low intensity bump exposure dose does not sufficiently reach certain portions of the photosensitive resin layer (i.e., the side of the photosensitive layer that is closest to the substrate layer and furthest from the source of actinic radiation), at which the removal of the dissolved oxygen is insufficient. In the subsequent main exposure, these portions will not cure sufficiently due to the remaining oxygen. Accordingly, after developing, the photosensitive layer may contain isolated dots having barrel-like shapes and thinning toward the substrate layer, thus resulting in the decline of durability.

If an attempt is made to quench the dissolved oxygen sufficiently in the side of the photosensitive layer that is closest to the support layer during the preliminary exposing step, the surface of the resin layer which is closest to the actinic radiation source receives too much radiation and undergoes unwanted cure. Also, if the main exposure is conducted for a longer period of time in order to sufficiently cure the side of the of the resin layer which is closest to the support layer, the etching depth of reverse portions may be shallow and positive features may end up rendered bolder than the original film negative. Thus, there remains a need in the art for improved methods of bump exposing relief image printing plates to overcome the drawbacks of the prior art.

Bump exposures are generally carried out with fluorescent UV tubes or medium pressure mercury arc lamps. However, the spectral output of these lamps is extremely wide, and their output spans wavelengths from below 320 nm in the UV region to over 800 nm in the infrared region, a span of more than 480 nm.

With such a broadband source, it is not possible to maximize the depth of penetration of the bump exposure radiation while maintaining good exposure speed. Some wavelengths may penetrate well, while other wavelengths may be absorbed strongly at the surface. The net result is that the maximum bump dose the plate can withstand and still process leaves the resin at the bottom of the photosensitive layer (i.e., the surface of the resin layer closest to the support sheet) significantly under-bumped and still rich with inhibiting oxygen.

Bump exposure dosages are normally determined empirically, by first increasing the exposure time until evidence of polymerization is seen, and then backing off by 5–10 percent. Because the photopolymer layers near the surface receive the highest dose of actinic radiation, what happens chemically in these layers dictates when the photopolymer as a whole has received its maximum bump exposure. Thus, it can be seen that the top layers of resin are essentially depleted of oxygen while the lower layers may still contain significant amounts of oxygen. This gradient of oxygen content throughout the resin thickness can lead to undercutting of some image features and reduced overall exposure sensitivity.

Other efforts to improve the removal of dissolved oxygen from relief image printing plates have involved special plate formulations alone or in combination with the bump exposure.

For example, U.S. Pat. No. 5,330,882 to Kawaguchi, the subject matter of which is herein incorporated by reference in its entirety, suggests the use of a separate dye that is added to the resin to absorb actinic radiation at wavelengths at least 100 nm removed from the wavelengths absorbed by the main photoinitiator. This allows separate optimization of the initiator amounts for the bump and main initiators. Unfortunately, these dyes are weak initiators and require protracted bump exposure times. In addition, these dyes sensitize the resin to regular room light, so inconvenient yellow safety light is required in the work environment. Lastly, the approach described by Kawaguchi employs conventional broadband-type sources of actinic radiation light for bump exposure, and thereby also tends to leave significant amounts of oxygen in the lower layers of the resin.

U.S. Pat. No. 4,540,649 to Sakurai, incorporated herein by reference in its entirety, describes a photopolymerizable composition that contains at least one water soluble polymer, a photopolymerization initiator and a condensation reaction product of N-methylol acrylamide, N-methylol methacrylamide, N-alkyloxymethyl acrylamide or N-alkyloxymethyl methacrylamide and a melamine derivative. According to the inventors, the composition eliminates the need for pre-exposure conditioning and produces a chemically and thermally stable plate.

U.S. Pat. No. 5,645,974 to Ohta et al., incorporated herein by reference in its entirety, discloses a photocurable mixture that includes paraffin or a similar waxy substance to inhibit effect of atmospheric oxygen. Due to its low solubility in the polymer, the paraffin floats at the beginning of the polymerization and forms a transparent surface layer that prevents the ingress of air. This approach does nothing to eliminate molecular oxygen already dissolved in the resin composition.

Other efforts have focused on adding an oxygen scavenger to the resin composition to suppress the action of the oxygen. The use of oxygen scavengers in resin systems is described, for example, in U.S. Pat. No. 3,479,185 to Chambers, Jr. and in U.S. Pat. No. 4,414,312 to Goff et al., the subject matter of each or which is herein incorporated by reference in its entirety.

Although various methods of inhibiting and/or removing dissolved oxygen in the photosensitive resin composition have previously been suggested, there remains a need in the art for an improved method of removing dissolved oxygen from the entirety of the photosensitive resin layer.

The inventors have surprisingly discovered that if the bump exposure is carried out by using substantially monochromatic actinic radiation (i.e., the range of wavelengths of the source of the radiation differ by no more than about 20 nm) and matching its wavelength with a photoinitiator of the correct type and concentration such that the optical density of that photoinitiator in the resin at the emitted wavelength is less than about 0.43, the bump exposure more effectively and uniformly removes the molecular dissolved oxygen throughout the entire resin thickness.

SUMMARY OF THE INVENTION

The present invention is directed to an improved process of producing a relief image printing plate, comprising the steps of:
a) providing a photosensitive printing element comprising:
  i) a support layer;
  ii) a layer of a photosensitive composition comprising:
    (a) one or more binders;
    (b) one or more monomers;
    (c) at least one photoinitiator; and
    (d) optionally, one or more ingredients selected from the group consisting of dyes, plasticizers, fillers, polymerization inhibitors and additives; and
  iii) optionally, a release layer selected from the group consisting of matte coatings and slip film layers; and
b) quenching dissolved oxygen in the photosensitive layer by pre-exposing the photosensitive layer to one or more sources of actinic radiation, wherein the range of wavelengths spanned by the one or more sources of actinic radiation is no more than about 20 nm; and
c) imagewise exposing the photosensitive layer to actinic radiation to crosslink and cure the photosensitive layer.

In a preferred embodiment, the at least one photoinitiator is present in the photosensitive composition in an amount sufficient to provide an optical density in the photosensitive composition of between about 0.05 and 0.43 at the wavelength used to pre-expose the resin composition.

The present invention is also directed to an improved photosensitive printing element, comprising:
a) a substrate;
b) a photopolymerizable resin composition comprising:
  i) one or more binders;
  ii) one or more monomers;
  iii) at least one photoinitiator, said at least one photoinitiator being present in the photosensitive composition in an amount sufficient to provide an optical density in the photosensitive composition of between about 0.05 and 0.43 at the wavelength used to pre-expose the resin composition; and
  iv) optionally, one or more ingredients selected from the group consisting of dyes, plasticizers, fillers, polymerization inhibitors and additives; and
c) optionally, a matte coating or a slip film layer.

DETAILED DESCRIPTION OF THE PREFERRED EMBODIMENTS OF THE INVENTION

The present invention is directed to an improved method of removing dissolved oxygen from a photosensitive resin layer of a relief image printing element using substantially monochromatic actinic radiation. The wavelength of the monochromatic radiation is matched with a photoinitiator of the correct type and concentration such that the optical density of that photoinitiator in the resin at the emitted wavelength is less than about 0.43. Therefore, the bump exposure more effectively and uniformly removes the molecular oxygen throughout the entire resin thickness, and by removing the oxygen more uniformly throughout the thickness of the resin, the main exposure is better able to cure the resin down to its bottom layers and thereby image finer features with less main exposure and with better defined shoulders.

The use of identical wavelengths for both bump exposure and main exposure is non-optimal. The ideal bump exposure would uniformly (as nearly as is practicable) remove oxygen from the photopolymer through its entire thickness. Photons of actinic radiation are absorbed at an exponentially decreasing rate through the thickness of the polymer (Beer's Law), so the lower the optical density (O.D.), the more uniform the removal of oxygen (to some practical limit; the inventors have found the range $0.05 \leq O.D. \leq 0.38$ to be preferred). On the other hand, the main exposure has optimal effect if the resin has an O.D. of approximately 0.43, which theoretically yields the maximum number of photons absorbed at the base of the polymer layer (also according to Beer's Law).

To achieve both of these conditions requires the careful selection of the photoinitiator package and the light sources for both bump and main exposures. Furthermore, it is preferable for the bump light source to emit a narrow range of wavelengths. The absorption curves of photoinitiators are never flat so only by using substantially monochromatic radiation can you obtain less variation in optical density and therefore a more uniform and consistent bump exposure.

The invention is directed to an improved method of producing a relief image printing plate, comprising the steps of:
a) providing a photosensitive printing element comprising:
  i) a support layer;
  ii) at least one layer of a photosensitive composition deposited on the support layer, the photosensitive composition comprising:
    (a) one or more binders;
    (b) one or more monomers;
    (c) at least one photoinitiator; and
    (d) optionally, one or more ingredients selected from the group consisting of dyes, plasticizers, fillers, polymerization inhibitors and additives; and
  iii) optionally a release layer on top of the photosensitive layer;
b) quenching dissolved oxygen in the photosensitive resin layer by pre-exposing the photosensitive resin layer to one or more sources of actinic radiation at a low intensity, wherein the range of wavelengths spanned by the one or more sources of actinic radiation is no more than about 20 nm;
c) imagewise exposing the photosensitive resin layer to actinic radiation at an intensity sufficient to crosslink and cure the photosensitive layer; and
d) selectively removing unexposed portions of the photosensitive layer by suitable developing means.

The chemistry of the photopolymer can be of any type that cures via a free radical mechanism. The most common types are those using acrylate and/or methacrylate monomers and oligomers. The uncured resin can be in either a liquid or solid state. The final cured plate can be of a hard type (letterpress plate) or soft type (flexographic plate used for packaging or newspaper printing).

In a preferred embodiment, the photosensitive printing element may contain an antihalation layer positioned between the support layer and the photosensitive layer to minimize halation caused by the scattering of UV light within the non-image areas of the photocurable resin layer.

The process of the invention is particularly suited to use with relief plates where the substrate is opaque and the bump exposure takes place from the front side of the plate. The substrate can be plastic, steel aluminum, or other metal, and of any thickness or rigidity. Furthermore, printing plates with relief layers of any thickness will benefit, but thicker plates will see the most benefit.

The wavelength of the bump is selected to match the absorption curve of a particular photoinitiator type and concentration, or the photoinitiator type and concentration are varied to match a particular source wavelength, or both. The photoinitiator sensitive to the bump wavelength can be sensitive solely to the bump exposure wavelength or it can also be sensitive to the wavelength(s) of the main exposure source. It is generally preferred that the range of wavelengths spanned by the source of actinic radiation be no more than about 20 nm.

The substantially monochromatic radiation necessary for the practice of this invention can be supplied by sources such as lasers, light emitting diodes, and broadband sources, such as fluorescent tubes, arc lamps, plasma lamps, etc., that have been filtered to pass only a selected narrow range of wavelengths. Most lasers and light emitting diodes naturally emit radiation that is already substantially monochromatic. They are available at many discreet wavelengths, ranging from the deep UV to the infrared. Some types of lasers include diode, gas, solid state, and fiber. They can be configured to emit at their fundamental frequency or frequency multiplied to give shorter wavelengths. The laser or light emitting diode can be used singly or in groups, as long as the range of wavelengths spanned by the group differ by no more than about 20 nm. The bump exposure can be delivered in a blanket fashion across the entire printing element simultaneously or in a scanning serial fashion.

The source of the actinic radiation is typically selected from the group consisting of lasers, light emitting diodes, and broadband sources that have been filtered to pass only a selected narrow range of wavelengths. Particularly preferred as sources of light in this invention are light emitting diodes emitting between about 394 and 405 nm. These sources are low cost, highly efficient, cool running and reliable. Furthermore these sources come up to power quickly and consistently.

Lower optical densities provide better uniformity in the oxygen removal. With less optical density, the light penetrates deeper into the resin. At lower optical densities, the radiation dosage received by the bottom layers of resin are more equal to the dosage received by the resin layers near the top. Conversely, when the actinic radiation is very strongly absorbed (i.e., high optical density), the top layers of resin receive a relatively high dose and the bottom layers of resin receive a relatively very low dose. In this case, the photochemical activity caused by the bump exposure is confined to only the very top layers of the resin, and the bottom resin layers remain mostly unaffected. Poor fine feature resolution and poorly defined shoulders can result.

The use of substantially monochromatic sources of actinic radiation for bump exposure allows the photoinitiator type and amount to be exactly chosen such that the optical density at that wavelength is set at its most optimum level. This is not possible with broadband sources of the prior art because the radiation absorptivity of photoinitiators vary greatly across the emission spectrum of broadband sources. When using broadband sources, there is always radiation striking the resin at wavelengths where the optical density is high, which limits the ability of the radiation to penetrate the resin deeply to quench the oxygen at bottom layers of the resin.

In contrast, in the present invention, the wavelength of bump radiation and the molar concentration of the photoinitiator can be chosen such that the optical density is low for the bump. For the main image-wise exposure, it has been calculated theoretically and tested empirically that an optical density of approximately 0.43 is optimum for maximizing exposure speed. This optical density is not optimum for the bump exposure however, where the goal is not to cure the resin but instead to pre-sensitize it as uniformly as possible.

One trade-off of lower optical densities, however, is that the overall photosensitivity of the resin is lowered and, therefore, the bump exposure time is extended. In general, this is not a problem for platemakers because bump exposure times tend to be much shorter than main exposure times. Thus, there is an optimum range where these two properties, uniformity and speed, are best balanced. In a preferred embodiment, the photoinitiator is present in the photopolymerizable resin composition in an amount sufficient to provide an optical density in the photopolymerizable resin composition of between about 0.05 and 0.43 at a wavelength used to bump expose the resin composition. More preferably, the optical density of the photoinitiator in the resin at a wavelength emitted by the actinic radiation is within the range of about 0.10 to about 0.38, most preferably within the range of about 0.15 to about 0.33.

Preferred photoinitiators for use in the photosensitive resin composition of the invention are generally selected from the group consisting of 1-hydroxycyclohexyl phenyl ketone, 2-benzyl-2-N,N-dimethylamino-1-(4-morpholinophenyl)-1 butanone, benzophenone, benzil, 2,2-dimethoxy-2-phenyl acetophenone, 2-methyl-1[4-(methylthio) phenyl]-2 morpholino propan-1-one, 2-hydroxy-2-methyl-1phenyl-propan-1-one, 2,6-dimethoxybenzolyl)-2,4-,trimethylpentyl phosphine oxide, 2,4,6-trimethylebenzoly diphenylphosphine oxide, 2,4,6-trimethylbenzoyl.

Optionally, but preferably, the bump exposure is performed from the front side of the plate. The image-wise exposure that follows the bump exposure of this invention can be carried out with either a laser source or a non-laser source, in either a parallel mode or a serial mode. It is preferable, however, that the image-wise exposure takes place within five minutes of the bump exposure. It is also preferable if the delay time between the bump and main exposures is substantially the same for all areas of the printing plate.

Once the photosensitive printing element has been image-wise exposed to actinic radiation, unexposed portions of the photosensitive layer are selectively removed using suitable developing means. The developing means are dependent on the formulation of the photosensitive resin layer and may involve solvent or water washing or a dry, thermal process (heat plus a blotter or air knife).

After the plates have been developed they may optionally be processed through an oven and/or post-exposure/detacking steps. Such processes are well known in the art.

What is claimed is:

1. A process of producing a relief image printing plate, the process comprising the steps of:
   a) providing a photosensitive printing element comprising:
       i) a support layer;
       ii) a layer of a photosensitive composition comprising:
           (a) one or more binders;
           (b) one or more monomers;
           (c) at least one photoinitiator; and
           (d) optionally, one or more ingredients selected from the group consisting of dyes, plasticizers, fillers, polymerization inhibitors and additives; and iii) optionally a release layer selected from the group consisting of matte coatings and slip film layers; and b) quenching dissolved oxygen in the photosensitive layer by pre-exposing the photosensitive layer to one or more sources of actinic radiation, wherein the range of wavelengths spanned by the one or more sources of actinic radiation is no more than about 20 nm; and c) imagewise exposing the photosensitive layer to actinic radiation to crosslink and cure the photosensitive layer;

wherein the at least one photoinitiator is effective at the pre-exposure radiation wavelength and is present in the photosensitive composition in an amount sufficient to provide an optical density through the thickness of the photosensitive composition of between about 0.05 and 0.43 at a wavelength used to pre-expose the photosensitive composition.

2. The method of claim 1, wherein the pre-exposing step is performed using actinic radiation at a wavelength between about 394 and 405 nm.

3. The method according to claim 1, wherein the optical density of the photoinitiator through the thickness of the resin at a wavelength emitted by the one or more sources of actinic radiation is within the range of about 0.10 to about 0.38.

4. The method according to claim 3, wherein the optical density of the photoinitiator through the thickness of the resin at a wavelength emitted by the one or more sources of actinic radiation is within the range of about 0.15 to about 0.33.

5. The method according to claim 1, wherein the one or more sources of actinic radiation are selected from the group consisting of lasers, light emitting diodes, and broadband sources that have been filtered to pass only a selected narrow range of wavelengths.

6. The method according to claim 1, wherein the support layer is selected from the group consisting of plastics, aluminum, steel, and other suitable metals.

7. The method according to claim 6, wherein the support layer is opaque.

8. The method according to claim 1, wherein the pre-exposing step is performed from the front side of the plate.

9. The method according to claim 1, wherein the delay time between the pre-exposing step and the imagewise exposing step is less than about 5 minutes.

10. The method according to claim 1, wherein the one or more sources of actinic radiation are substantially monochromatic.

11. The method according to claim 10, wherein the one or more sources of monochromatic radiation are used in groups and the range of wavelengths spanned by the group differ by no more than 20 am.

12. The method according to claim 1, wherein the one or more sources of monochromatic radiation are used singly.

13. A photosensitive printing element comprising, in order:

a) a substrate;

b) a photosensitive composition comprising:
  i) one or more binders;
  ii) one or more monomers;
  iii) at least one photoinitiator, said at least one photoinitiator being present in the photosensitive composition in an amount sufficient to provide an optical density through the thickness of the photosensitive composition of between about 0.05 and 0.43 at a wavelength used to pre-expose the photosensitive composition; and
  iv) optionally, one or more ingredients selected from the group consisting of dyes, plasticizers, fillers, polymerization inhibitors and additives; and c) optionally, a matte coating or a slip film layer;

wherein the photosensitive composition is exposed to, at least in part, actinic radiation with a range of wavelengths no more than about 20 nm.

14. The photosensitive printing element of claim 13, wherein the substrate is selected from the group consisting of plastics, aluminum, steel, and other suitable metals.

15. The photosensitive printing element of claim 14, wherein the substrate is opaque.

16. The photosensitive printing element of claim 13, wherein the optical density of the photoinitiator through the thickness of the photosensitive composition at a wavelength emitted by the actinic radiation is within the range of about 0.10 to about 0.38.

17. The photosensitive printing element of claim 16, wherein the optical density of the photoinitiator through the thickness of the photosensitive composition at a wavelength emitted by the actinic radiation is within the range of about 0.15 to about 0.33.

18. The photosensitive printing element of claim 16, further comprising an adhesion or antihalation layer positioned between the substrate and the photosensitive composition.

* * * * *

UNITED STATES PATENT AND TRADEMARK OFFICE
CERTIFICATE OF CORRECTION

PATENT NO. : 7,125,650 B2 Page 1 of 1
APPLICATION NO. : 10/894979
DATED : October 24, 2006
INVENTOR(S) : David H. Roberts et al.

It is certified that error appears in the above-identified patent and that said Letters Patent is hereby corrected as shown below:

Column 10

Line 4, delete "20 am." and replace it with --20 nm.--

Signed and Sealed this

Twentieth Day of November, 2007

JON W. DUDAS
*Director of the United States Patent and Trademark Office*